(12) United States Patent
Dreiskemper et al.

(10) Patent No.: US 7,671,755 B2
(45) Date of Patent: Mar. 2, 2010

(54) BATTERY CURRENT SENSOR FOR A MOTOR VEHICLE

(75) Inventors: Heinrich-Wilhelm Dreiskemper, Gladbeck (DE); Holger Lenhard, Witten (DE)

(73) Assignee: Leopold Kostal GmbH & Co. KG, Luedenscheid (DE)

( * ) Notice: Subject to any disclaimer, the term of this patent is extended or adjusted under 35 U.S.C. 154(b) by 528 days.

(21) Appl. No.: 11/788,701

(22) Filed: Apr. 20, 2007

(65) Prior Publication Data
US 2007/0200720 A1  Aug. 30, 2007

Related U.S. Application Data

(63) Continuation of application No. PCT/EP2005/011678, filed on Nov. 2, 2005.

(30) Foreign Application Priority Data
Nov. 3, 2004  (DE) .................. 10 2004 053 648

(51) Int. Cl.
*G08B 21/00*  (2006.01)
(52) U.S. Cl. ............... 340/636.1; 340/425.5; 455/575.1
(58) Field of Classification Search ............. 340/425.5, 340/636.1; 455/575.1; 180/65.8; 700/297; 702/63; 320/134, 152
See application file for complete search history.

(56) References Cited

U.S. PATENT DOCUMENTS

| 4,513,499 | A | 4/1985 | Roldan |
|---|---|---|---|
| 4,795,378 | A | 1/1989 | Tomizu et al. |
| 4,897,053 | A | 1/1990 | Verhoeven et al. |
| 6,218,805 | B1 | 4/2001 | Melcher |
| 6,304,062 | B1 | 10/2001 | Batson |
| 6,744,344 | B2 | 6/2004 | Geuder et al. |
| 6,787,935 | B2 | 9/2004 | Heim |
| 6,808,841 | B2 | 10/2004 | Wakata et al. |
| 2002/0051907 | A1 | 5/2002 | Wakata et al. |
| 2004/0004530 | A1 | 1/2004 | Geuder et al. |

FOREIGN PATENT DOCUMENTS

| DE | 100 27 519 A1 | 1/2002 |
|---|---|---|
| DE | 203 18 266 U1 | 2/2004 |
| EP | 0 731 526 A2 | 9/1996 |
| EP | 1 204 166 A1 | 5/2002 |
| WO | WO 99/54744 | 10/1999 |

*Primary Examiner*—Benjamin C Lee
*Assistant Examiner*—Samuel J Walk
(74) *Attorney, Agent, or Firm*—Brooks Kushman P.C.

(57) ABSTRACT

A battery current sensing device for the battery of a vehicle includes a current sensor, a substrate having a measuring circuit, and a connecting element having first and second ends. The current sensor is connected to the battery to receive current flow of the battery. One end of the connecting element is electrically and mechanically connected to the substrate and the other end of the connecting element is electrically and mechanically connected to the current sensor such that the connecting element electrically and mechanically connects the substrate in a fixed position to the current sensor with the measuring circuit being electrically connected to the current sensor. The first end of the connecting element includes a press-fit contact for establishing the connection to one of the current sensor and the substrate.

20 Claims, 2 Drawing Sheets

BATTERY CURRENT SENSOR FOR A MOTOR VEHICLE

CROSS-REFERENCE TO RELATED APPLICATIONS

This application is a continuation of International Application No. PCT/EP2005/011678, published in German, with an international filing date of Nov. 2, 2005, which claims priority to DE 10 2004 053 648.1, filed Nov. 3, 2004, the disclosures of which are both hereby incorporated by reference.

BACKGROUND OF THE INVENTION

1. Field of the Invention

The present invention relates to a battery current sensing device having a current sensor electrically connected to the battery of a vehicle and having a measuring circuit on a printed circuit board which is electrically and mechanically connected in a fixed position relative to the current sensor such that the measuring circuit is electrically connected to the current sensor.

2. Background Art

DE 199 61 311 A1 (corresponds to U.S. Pat. No. 6,787,935) describes a battery current sensing device which is mechanically mounted on a pole terminal of a battery of a vehicle. The device includes a current sensor having a measuring resistor between contact surfaces of the sensor. Soldered connections electrically and mechanically connect the sensor to a printed circuit board ("PCB"). The contact surfaces of the sensor are made of copper and the measuring resistor is made of manganin (i.e., an alloy of copper, manganese, and nickel). The sensor and the PCB have similar thermal expansion coefficients.

A problem is that the measuring resistor of the current sensor of a battery current sensing device is subjected to severe temperature fluctuations during vehicle operation. For example, the measuring resistor is cold when the vehicle has been parked in cold temperature for a long time. Upon the vehicle being started, several hundred amperes of current flow through and heat the measuring resistor. The temperature rise of the measuring resistor may exceed 100° C. causing considerable thermal expansion of the resistor.

A typical design of a battery current sensing device includes a PCB fixedly connected (i.e., connected via non-flexible leads) to the current sensor. This design is typical as it is economical and can be manufactured easily. However, a problem arises in matching the size of the expanding measuring resistor with the PCB. That is, the non-flexible lead lines do not provide much play to accommodate the size expansion of the measuring resistor relative to the PCB.

As indicated above, a solution to this problem includes making the measuring resistor and the PCB out of materials having similar coefficients of thermal expansion. However, a disadvantage with this solution is that the selection of possible materials to use for both the measuring resistor and the PCB is limited. Further, this solution partially solves the problem as temperature equalization between the measuring resistor and the PCB requires a certain time with the result being that temperature-related mechanical stresses cannot be avoided. Furthermore, the PCB should not assume the temperature of the measuring resistor, which can be quite high, to protect electronic components (e.g., a measuring circuit) on the PCB.

SUMMARY OF THE INVENTION

An object of the present invention is a battery current sensing device having a current sensor electrically connected to a battery and electrically and mechanically connected to a circuit substrate (e.g., a printed circuit board) in such a way that the problems resulting from the thermal expansion of the measuring resistor of the current sensor relative to the circuit substrate are avoided.

In carrying out the above object and other objects, the present invention provides a battery current sensing device for the battery of a vehicle. The battery sensing device includes a current sensor connected to the battery to receive current flow of the battery, a circuit substrate having a measuring circuit, and a connecting element having first and second ends. The first end of the connecting element is electrically and mechanically connected to the substrate and the second end of the connecting element is electrically and mechanically connected to the current sensor such that the connecting element electrically and mechanically connects the substrate in a fixed position to the current sensor with the measuring circuit being electrically connected to the current sensor. At least one of the first end and second end of the connecting element includes a press-fit contact for establishing the corresponding connection to the current sensor and the substrate.

Further, in carrying out the above object and other objects, the present invention provides a battery current sensing device for the battery of a vehicle. The battery current sensing device includes a current sensor connected to the battery to receive current flow of the battery, a circuit substrate having a measuring circuit, and a plurality of connecting elements. Each connecting element has a first end and a second end. The first end of each connecting element is electrically and mechanically connected to the substrate and the second end of each connecting element is electrically and mechanically connected to the current sensor such that the connecting elements electrically and mechanically connect the substrate in a fixed position to the current sensor with the measuring circuit being electrically connected to the current sensor. The first end of each connecting element includes an elastic press-fit contact for establishing the connection to the substrate.

Also, in carrying out the above object and other objects, the present invention provides a battery current sensing device for the battery of a vehicle. The battery current sensing device includes a current sensor connected to the battery to receive current flow of the battery, a circuit substrate having a measuring circuit, and a plurality of connecting elements. Each connecting element has a first end and a second end. The first end of each connecting element is electrically and mechanically connected to the current sensor and the second end of each connecting element is electrically and mechanically connected to the substrate such that the connecting elements electrically and mechanically connect the substrate in a fixed position to the current sensor with the measuring circuit being electrically connected to the current sensor. The first end of each connecting element includes an elastic press-fit contact for establishing the connection to the current sensor. Each connecting element has an elastic middle region between the elastic press-fit contact and the second end of the connecting element.

A battery current sensing device in accordance with an embodiment of the present invention includes connecting elements which each have at least one press-fit contact connected to at least one of the current sensor and the circuit substrate. The connecting elements on account of their elastic properties resulting from the elastic effect of the press-fit contacts provide a mechanically stationary yet non-rigid mechanical and electrical connection between the circuit substrate and the current sensor. As a result, the battery current sensing device in a simple and economic manner avoids temperature-related mechanical stresses.

The press-fit contacts of the connecting elements provide a mechanical connection having a low thermal coupling between the current sensor and the circuit substrate. As a result, the temperature of the circuit substrate may be matched to the average temperature of the current sensor over a long time period, and temperature peaks in the current sensor, which may occur during vehicle start-up, do not excessively heat the circuit substrate and the temperature-sensitive electronic components of the measuring circuit. Additionally, the press-fit contacts of the connecting elements provide a simple and reversible installation of the circuit substrate to the current sensor.

The current sensor itself may be a metal strip. A measuring circuit on the circuit substrate is electrically connected to the metal strip to evaluate a physical variable dependent on the battery current flow through the metal strip. The physical variable dependent on the current flow through the metal strip may be a magnetic field or heating resulting from the current flow. A simple method of current flow measurement is to consider a section of the metal strip as a measuring resistor and detect the drop in voltage at that location.

BRIEF DESCRIPTION OF THE DRAWINGS

A battery current sensing device in accordance with embodiments of the present invention is explained in greater detail below with reference to the drawings which include the following.

DETAILED DESCRIPTION OF THE PREFERRED EMBODIMENT(S)

Figure 1:
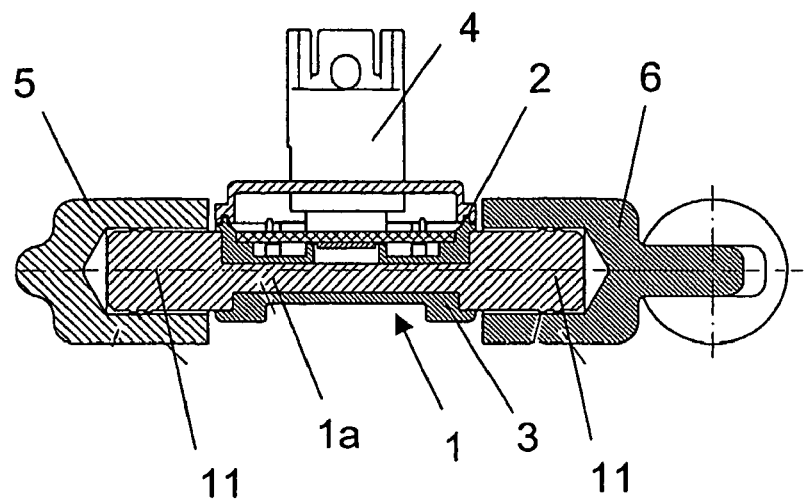
FIG. 1 illustrates a cross-sectional view of a battery current sensing device for the battery of a vehicle in accordance with an embodiment of the present invention.

Referring now to FIG. 1, a cross-sectional view of a battery current sensing device for the battery of a vehicle in accordance with an embodiment of the present invention is shown. The battery current sensing device includes a current sensor 1. Current sensor 1 includes a measuring resistor 1a. In this embodiment, measuring resistor 1a is in the form of a one-piece, metal strip.

The battery current sensing device includes a plastic housing 2 for housing current sensor 1. Housing 2 has a plastic extrusion coating 3 in the center region of measuring resistor 1a. Housing 2 includes a housing lid 9. Housing lid 9 is joined to plastic extrusion coating 3 via a laser weld or the like. Housing lid 9 includes a molded-on plug housing which is a part of a plug-in connector 4. That is, plug-in connector 4 is integrally molded to housing lid 9.

Current sensor 1 includes two end sections. Measuring resistor 1a is between the two end sections of current sensor 1. First and second cylindrical molded end pieces 11 are respectively connected to the end sections of current sensor 1. A first connector 5 is electrically and mechanically connected to first end piece 11. A second connector 6 is electrically and mechanically connected to second end piece 11. Connectors 5, 6 are rotatable about the respective center axes of end pieces 11. After the positions of connecting elements 5, 6 are fixed in place relative to current sensor 1, their positions are locked by pressing the connecting sites together.

Figure 2:
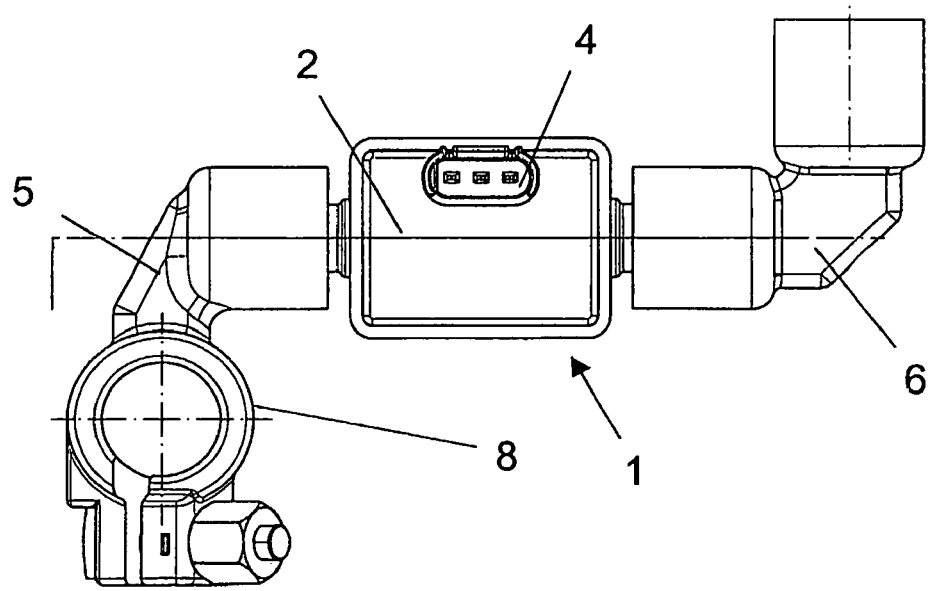
FIG. 2 illustrates a top view of the battery current sensing device.

Referring now to FIG. 2, with continual reference to FIG. 1, a top view of the battery current sensing device is shown. First connector 5 is an electrical and mechanical connector having a battery pole terminal 8. Battery pole terminal 8 includes an annular clamping element for electrically and mechanically connecting first connector 5 to a cylindrical or conical pole of the battery of the vehicle. Second connector 6 is an electrical and mechanical connector designed as a screw-on, plug-in, or clamp-on connector. Second connector 6 establishes an electrical and mechanical connection to a cable of the battery of the vehicle.

In this manner, the current of the battery flows through measuring resistor 1a. A measuring circuit of the battery current sensing device is electrically connected to measuring resistor 1a. The measuring circuit evaluates the voltage drop at the extrusion-coated section of measuring resistor 1a. The measuring circuit generates a measurement signal corresponding to the current flow through measuring resistor 1a. The measuring circuit is electrically connected to plug-in connector 4 and provides the measurement signal to plug-in connector 4.

As connectors 5, 6 are rotatably connected to current sensor 1 via end pieces 11, the positioning of connectors 5, 6 relative to current sensor 1 may be flexibly matched to particular vehicle-specific circumstances. In addition, other types of connectors 5, 6 which are matched in a vehicle-specific manner may be used without the need to make structural changes to current sensor 1. This allows the battery current sensing device to be simply and economically matched to the batteries of different vehicles. The the rotatable connection between connectors 5, 6 and current sensor 1 is ultimately fixed in place, for example by pressing connectors 5, 6 towards one another, after connectors 5, 6 are positioned relative to current sensor 1.

Figure 3:
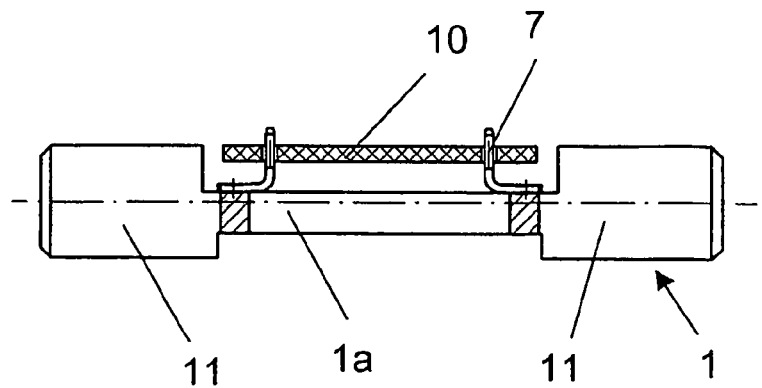
FIG. 3 illustrates a side view of the battery current sensing device.

Referring now to FIG. 3, with continual reference to FIGS. 1 and 2, a side view of the battery current sensing device is shown. The battery current sensing device further includes a circuit substrate 10. Circuit substrate 10 may be a printed circuit board ("PCB") or a ceramic substrate. The components of the measuring circuit are situated on circuit substrate 10. The measuring circuit receives the current signal of measuring resistor 1a to be evaluated. The measurement circuit measures the voltage drop, proportional to the battery current, across measuring resistor 1a.

Connecting elements 7 electrically and mechanically connect current sensor 1 and circuit substrate 10 together. Current sensor 1 supplies the current signal of measuring resistor 1a to the measurement circuit via connecting elements 7 and circuit substrate 10.

Figure 4:
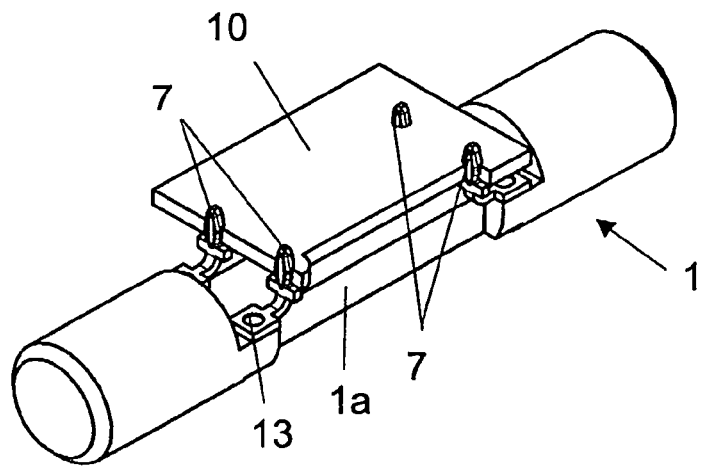
FIG. 4 illustrates a perspective view of the battery current sensing device.

Referring now to FIG. 4, with continual reference to FIGS. 1, 2, and 3, a perspective view of the battery current sensing device is shown. The battery current sensing device includes four connecting elements 7 which electrically and mechanically connect measuring resistor 1a and circuit substrate 10. In this embodiment, each connecting element 7 is a metal part bent at a right angle. Each connecting element 7 includes a connecting section 13 and an end section 12. Connecting section 13 of each connecting element 7 is electrically and fixedly mechanically connected to measuring resistor 1a. For example, the connection between connecting sections 13 and measuring resistor 1a is a soldered or welded connection. End section 12 of each connecting element 7 is electrically and fixedly mechanically connected to circuit substrate 10. More particularly, each end section 12 is a press-fit contact 12 which inserts into a respective recess 15 in circuit substrate 10 having electrically conductive edge regions.

In this manner, the measuring circuit receives the voltage drop generated by measuring resistor 1a for evaluation. Preferably, the measuring circuit is a high-resistance measuring circuit for evaluating the voltage drop at measuring resistor 1a such that any slight transition resistance resulting from press-in contacts 12 and circuit substrate 10 in the connecting region are not critical for the measurement result.

Connecting elements 7 are elastic. On account of the elastic properties of connecting elements 7, the thermal expansion of measuring resistor 1a which changes during operation due to the fluctuating temperature of measuring resistor 1a (or current sensor 1) does not result in mechanical stresses in the connections made by connecting elements 7 between current sensor 1 and circuit substrate 10.

Figure 5:
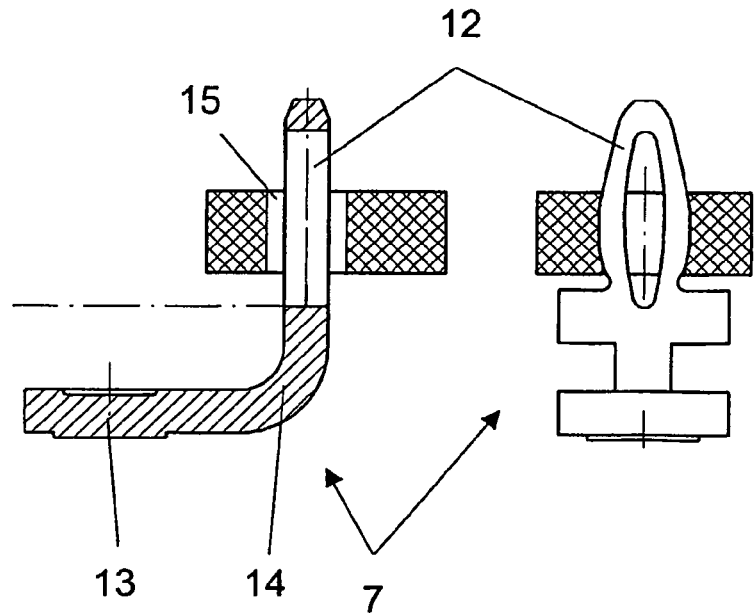
FIG. 5 illustrates two embodiments of a connecting element in accordance with the present invention.

Referring now to FIG. 5, with continual reference to FIGS. 1, 2, 3, and 4, two embodiments of a connecting element 7 in accordance with the present invention are shown. In one embodiment shown on the right-hand side of FIG. 5, press-fit contact 12 of connecting element 7 has the shape of an eyelet. In either embodiment, due to its elastic properties, connecting element 7 compensates for thermal elongation of measuring resistor 1a in the transverse direction thereof. A region 14 between press-fit contact 12 and connecting section 13 of connecting element 7 is at least partially elastic to compensate for the thermal elongation in the longitudinal direction of current sensor 1.

Other embodiments of the battery current sensing device are to be appreciated. For example, connecting elements 7 may be fixedly connected to circuit substrate 10 and elastically connected to measuring resistor 1a (or current sensor 1). As another example, both ends of connecting elements 7 may include elastic press-in contacts 12.

REFERENCE NUMERALS

1 Current sensor
1a Measuring resistor
2 Housing
3 Plastic extrusion coating
4 Plug-in connector
5 First connector
6 Second connector
7 Connecting elements
8 Battery pole terminal
9 Housing lid
10 Circuit substrate
11 Molded end pieces
12 Press-in contact
13 Connecting section
14 Elastic region
15 Recess While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. A battery current sensing device for the battery of a vehicle, the device comprising:
   a current sensor connected to the battery to receive current flow of the battery;
   a substrate having a measuring circuit; and
   a connecting element having a first end and a second end, the first end of the connecting element being electrically and mechanically connected to the substrate and the second end of the connecting element being electrically and mechanically connected to the current sensor such that the connecting element electrically and mechanically connects the substrate in a fixed position to the current sensor with the measuring circuit being electrically connected to the current sensor, wherein at least one of the first end and the second end of the connecting element includes a press-fit contact for establishing the corresponding connection to the current sensor and the substrate.

2. The device of claim 1 wherein:
   the second end of the connecting element includes a connecting section for fixedly establishing the connection to one of the current sensor and the substrate.

3. The device of claim 2 wherein:
   the connection between the second end of the connecting element and the one of the current sensor and the substrate is a soldered connection.

4. The device of claim 2 wherein:
   the connection between the second end of the connecting element and the one of the current sensor and the substrate is a welded connection.

5. The device of claim 1 wherein:
   the press-fit contact includes an elastic eyelet.

6. The device of claim 1 wherein:
   the connecting element is a metal part bent at a right angle.

7. The device of claim 2 wherein:
   the connecting element has an elastic middle region between the press-fit contact and the connecting section.

8. The device of claim 1 wherein:
   the substrate is a printed circuit board.

9. The device of claim 1 wherein:
   the substrate is a ceramic substrate.

10. The device of claim 1 wherein:
    the press-fit contact is connected to the substrate and the connecting section is connected to the current sensor.

11. The device of claim 1 wherein:
    the current sensor includes a measuring resistor.

12. The device of claim 11 wherein:
    the measuring resistor is a metal strip.

13. A battery current sensing device for the battery of a vehicle, the device comprising:
    a current sensor connected to the battery to receive current flow of the battery;
    a substrate having a measuring circuit; and
    a plurality of connecting elements, each connecting element having a first end and a second end, the first end of each connecting element being electrically and mechanically connected to the substrate and the second end of each connecting element being electrically and mechanically connected to the current sensor such that the connecting elements electrically and mechanically connect the substrate in a fixed position to the current sensor with the measuring circuit being electrically connected to the current sensor, wherein the first end of each connecting element includes an elastic press-fit contact for establishing the connection to the substrate.

14. The device of claim 13 wherein:
the second end of each connecting element includes a connecting section for fixedly establishing the connection to the current sensor.

15. The device of claim 14 wherein:
the connection between the second end of each connecting element and the current sensor is a soldered connection.

16. The device of claim 14 wherein:
the connection between the second end of each connecting element and the current sensor is a welded connection.

17. The device of claim 13 wherein:
the elastic press-fit contact of each connecting element includes an elastic eyelet.

18. The device of claim 13 wherein:
each connecting element is a metal part bent at a right angle.

19. The device of claim 14 wherein:
each connecting element has an elastic middle region between the elastic press-fit contact and the connecting section of the connecting element.

20. A battery current sensing device for the battery of a vehicle, the device comprising:
a current sensor connected to the battery to receive current flow of the battery;
a substrate having a measuring circuit; and
a plurality of connecting elements, each connecting element having a first end and a second end, the first end of each connecting element being electrically and mechanically connected to the current sensor and the second end of each connecting element being electrically and mechanically connected to the substrate such that the connecting elements electrically and mechanically connect the substrate in a fixed position to the current sensor with the measuring circuit being electrically connected to the current sensor, wherein the first end of each connecting element includes an elastic press-fit contact for establishing the connection to the current sensor, wherein each connecting element has an elastic middle region between the elastic press-fit contact and the second end of the connecting element.

* * * * *